United States Patent
Schnabel et al.

(10) Patent No.: US 7,180,805 B2
(45) Date of Patent: Feb. 20, 2007

(54) DIFFERENTAL CURRENT SOURCE FOR GENERATING DRAM REFRESH SIGNAL

(75) Inventors: Joachim Schnabel, Munich (DE); Andre Schaefer, Munich (DE)

(73) Assignee: Infineon Technologies AG, Munich (DE)

( * ) Notice: Subject to any disclaimer, the term of this patent is extended or adjusted under 35 U.S.C. 154(b) by 305 days.

(21) Appl. No.: 10/386,147

(22) Filed: Mar. 11, 2003

(65) Prior Publication Data

US 2004/0004867 A1    Jan. 8, 2004

(30) Foreign Application Priority Data

Mar. 28, 2002  (DE) ................. 102 14 101

(51) Int. Cl.
*G11C 7/00* (2006.01)
(52) U.S. Cl. ..................... 365/222; 365/211
(58) Field of Classification Search ................ 365/222, 365/204, 189.07, 189.09
See application file for complete search history.

(56) References Cited

U.S. PATENT DOCUMENTS

| | | | | |
|---|---|---|---|---|
| 4,393,477 A | * | 7/1983 | Murotani ..................... | 365/222 |
| 4,977,537 A | * | 12/1990 | Dias et al. .................. | 365/222 |
| 5,278,796 A | * | 1/1994 | Tillinghast et al. ......... | 365/211 |
| 5,699,024 A | | 12/1997 | Manlove et al. | |
| 5,903,506 A | * | 5/1999 | Blodgett ..................... | 365/222 |
| 6,157,245 A | * | 12/2000 | Rincon-Mora ............... | 327/539 |
| 6,191,660 B1 | | 2/2001 | Mar et al. | |
| 6,272,039 B1 | * | 8/2001 | Clemens et al. ............. | 365/154 |
| 6,404,690 B2 | * | 6/2002 | Johnson et al. ............. | 365/222 |
| 6,531,911 B1 | * | 3/2003 | Hsu et al. ................... | 327/512 |
| 6,631,503 B2 | * | 10/2003 | Hsu et al. ...................... | 716/4 |
| 6,856,566 B2 | * | 2/2005 | Takahashi et al. .......... | 365/222 |
| 2001/0036118 A1 | | 11/2001 | Johnson et al. | |

FOREIGN PATENT DOCUMENTS

DE    100 21 085 C1    2/2002
JP    2000036726 A    2/2000

OTHER PUBLICATIONS

Sidong Cai, "High Precision Voltage-to-Frequency Converter," IEEE, pp. 1141-1144 (May 1995).
U. Tietze et al. Halbleiter-Schaltungs-technik, 10 Auflage, pp. 558-561, 896-901.

* cited by examiner

*Primary Examiner*—Thong Q. Le
(74) *Attorney, Agent, or Firm*—Fish & Richardson P.C.

(57) ABSTRACT

A circuit for generating a refresh signal for a memory cell of a semiconductor memory includes a capacitor and a differential current source for providing a charging current to the capacitor. The differential current source includes a temperature-dependent and a temperature-independent current source connected such that the charging current is proportional to a difference between a temperature-dependent current and a temperature-independent current. A comparator a voltage at a capacitor terminal and a reference voltage. The comparator generates a refresh signal when capacitor voltage exceeds the reference voltage.

14 Claims, 1 Drawing Sheet

DIFFERENTAL CURRENT SOURCE FOR GENERATING DRAM REFRESH SIGNAL

FIELD OF INVENTION

The present invention relates to a device and a method for outputting a refresh signal for a memory cell of a semiconductor memory device, which is preferably a DRAM memory.

RELATED APPLICATIONS

This application claims the benefit of the Mar. 28, 2002 priority date of German application DE 102 14 101.0, the contents of which are herein incorporated by reference.

BACKGROUND

DRAMs or dynamic semiconductor memories comprise a multiplicity of memory cells in order to store information. The memory cells of a DRAM can retain their information only for a specific time. For this reason, a refresh must be carried out at specific time intervals. Devices for generating a refresh signal for a memory cell of a semiconductor memory device are known which periodically generate a refresh signal and output it to the memory cell. However, these devices have the disadvantage that the refresh frequency or refresh period is the same for all operating temperatures of the semiconductor memory device, and, consequently, in particular at low temperatures, for which a lower refresh frequency suffices, a refresh signal is output more often than necessary and, consequently, current is consumed unnecessarily by the semiconductor memory device.

SUMMARY

For this reason, it is an object of the present invention to provide a device and a method for generating a refresh signal for a memory cell of a semiconductor memory device which make it possible to control the period duration of a refresh signal in a manner dependent on the temperature.

The present invention provides a device for generating a refresh signal for a memory cell or a memory cell array of a semiconductor memory device, the device comprising:
  a capacitor;
  a differential current source for providing a capacitor charging current for charging the capacitor, the differential current source comprising a temperature-dependent current source for providing a current having a temperature-dependent current intensity, and a temperature-independent or constant current source for providing a current having a temperature-independent or constant current intensity, and the temperature-dependent current source and the temperature-independent or constant current source being connected to one another in such a way that the current intensity of the capacitor charging current is proportional to the difference between the temperature-dependent current intensity and the temperature-independent current intensity; and
  a comparator, whose first comparator input is electrically connected to the capacitor and whose second comparator input is connected to a reference value transmitter for providing a predeterminable reference voltage, the comparator being designed for a voltage comparison between the capacitor voltage present at the capacitor and the reference voltage and, if the capacitor voltage exceeds the reference voltage, for outputting the refresh signal.

Preferably, the present invention furthermore provides a device for generating a refresh signal for a memory cell or a memory cell array of a semiconductor memory device, the device comprising:
  a capacitor;
  a differential current source for providing a capacitor charging current for charging the capacitor, the differential current source comprising a temperature-dependent current source for providing a current having a temperature-dependent current intensity and a temperature-independent or constant current source for providing a current having a temperature-independent or constant current intensity, and the temperature-dependent current source and the temperature-independent current source being connected to one another in such a way that the current intensity of the capacitor charging current is proportional to the difference between the temperature-dependent current intensity and the temperature-independent current intensity; and
  a comparator, whose first comparator input is electrically connected to the capacitor and whose second comparator input is connected to a reference value transmitter for providing a predeterminable reference voltage potential, the comparator being designed for a voltage potential comparison between the capacitor voltage potential present at the capacitor and the reference voltage potential and, if the capacitor voltage potential exceeds the reference voltage potential, for outputting the refresh signal.

The refresh signal triggers, in the semiconductor memory device, a refresh or an updating of the memory cell or the memory cell array. What can be achieved by virtue of the fact that the capacitor is charged by means of a temperature-dependent current is that the refresh signal output by the comparator is likewise temperature-dependent.

Furthermore, by forming the difference between the current having the temperature-dependent current intensity and the current having the temperature-independent current intensity, it is possible to increase the relative change in the current intensity of the capacitor charging current.

In a preferred embodiment, the device furthermore comprises a switch for resetting or discharging the capacitor. The switch is preferably kept closed until the capacitor has completely discharged. However, it is also conceivable that the capacitor is not completely discharged and the capacitor voltage is only lowered down to a value which lies below the reference voltage.

Preferably, the switch is in signal connection to the comparator in such a way that the capacitor is reset when the refresh signal is output.

In a preferred embodiment, the current of the temperature-dependent current source is a current of a bandgap circuit of the semiconductor memory device or is proportional thereto.

Preferably, the temperature-dependent current source comprises a first current mirror for mirroring and preferably multiplying, preferably by the factor n, the current having the temperature-dependent current intensity.

A virtually arbitrary adaptation of the temperature gradient of the refresh signal can be achieved through a suitable choice of the factor n and the temperature-independent current intensity.

Preferably, the temperature-dependent current source furthermore comprises a second current mirror for mirroring the output current of the first current mirror.

Preferably, furthermore, the temperature-independent current source comprises a current mirror for mirroring the current having the temperature-independent current intensity.

The memory cell is preferably a DRAM memory cell.

In a preferred embodiment, the device according to the invention furthermore comprises a temperature-independent or constant voltage source for providing a predeterminable temperature-independent or constant voltage, a first capacitor electrode being electrically connected to the differential current source and a second capacitor electrode being electrically connected to the temperature-independent voltage source.

The present invention furthermore provides a method for generating a refresh signal for a memory cell or a memory cell array of a semiconductor memory device, the method comprising the following steps:

- charging of a capacitor by means of a current, which is proportional to the difference between a current having a temperature-dependent current intensity and a current having a temperature-independent or constant current intensity;
- comparison of the capacitor voltage present at the capacitor with a predeterminable, preferably temperature-independent or constant, reference voltage by means of a comparator; and
- outputting of the refresh signal by the comparator if the capacitor voltage exceeds the reference voltage.

Preferably, instead of the capacitor voltage and the reference voltage, the capacitor voltage potential and the reference voltage potential can also be compared with one another.

Preferably, the method furthermore comprises a step of resetting of the capacitor, the resetting step essentially being effected at the same time as the step of outputting of the refresh signal.

BRIEF DESCRIPTION OF THE DRAWINGS

Further objects, features and advantages of the present invention will become apparent from the exemplary description of a preferred embodiment with reference to the drawing, in which.

DETAILED DESCRIPTION

Figure 1:
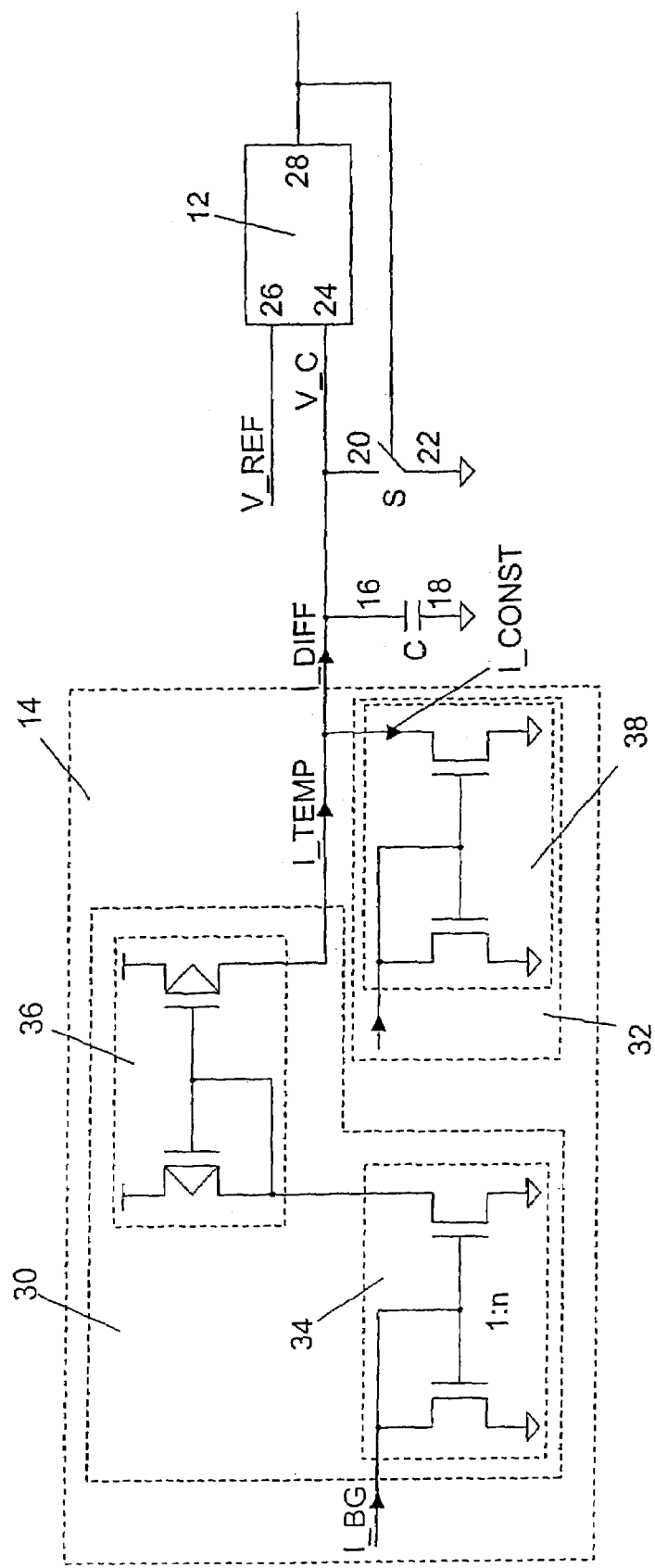
FIG. 1 shows a schematic view of a device in accordance with a preferred embodiment of the present invention.

Firstly, the construction of a device in accordance with a preferred embodiment of the present invention will be described with reference to FIG. 1. FIG. 1 shows a schematic view of a device in accordance with a preferred embodiment of the present invention.

The device 10 according to the invention comprises a capacitor C, a comparator 12, a switch S and a differential current source 14.

At its first capacitor electrode or its first capacitor pole or contact 16, the capacitor is electrically connected to the differential current source 14. The second capacitor electrode or the second capacitor pole or contact 18 is connected to ground or is grounded. Furthermore, the first capacitor electrode 16 is electrically connected to a first switch contact 20 of the switch S. The second switch contact 22 is likewise connected to ground.

Furthermore, the first capacitor electrode 16 is electrically connected to the first comparator input 24, i.e. the voltage V_C present at the capacitor C is present at the comparator input 24. A temperature-independent or constant reference voltage V_REF is present at the second comparator input 26. The output 28 of the comparator 12 is signal-connected to the switch S.

As an alternative to the embodiment described above, it is furthermore conceivable for the second capacitor electrode 18 not to be connected to ground, but rather to have a predeterminable voltage potential applied to it. By way of example, the second capacitor electrode 18 may be connected to a temperature-independent voltage source (not shown). In this case, the second switch contact 22 is electrically connected to the second capacitor electrode 18.

The construction of the differential current source 14 is described in detail below.

The differential current source 14 comprises a temperature-dependent current source 30 and a temperature-independent or constant current source 32.

The temperature-dependent current source 30 comprises a first current mirror 34 for mirroring a current I_BG having a temperature-dependent current intensity. Furthermore, the current I_BG is multiplied and a factor n. The temperature-dependent current I_BG is preferably a current of a bandgap circuit of the semiconductor memory device. Bandgap circuits are known multifariously in the prior art. "Hablbleiterschaltungen" ["Semiconductor circuits"] by U. Tietze and Ch. Schenk, 10th edition, pages 558–560, in particular FIG. 18.29, shows an exemplary bandgap circuit for generating a temperature-dependent current. The entire contents of this description of the bandgap circuit are considered to be disclosed herein.

The first current mirror 34 preferably comprises two n-channel field-effect transistors, the channel width of the field-effect transistor arranged on the left in FIG. 1 preferably being n times as large as the channel width of the field-effect transistor of the current mirror 34 that is arranged on the right in FIG. 1.

The current which is mirrored by the first current mirror 34 and multiplied by the factor n is once again mirrored by the second current mirror 36. The second current mirror 36 preferably comprises two p-channel field-effect transistors. A temperature-dependent current I_TEMP flows at the output of the second current mirror 36.

The temperature-independent current source 32 comprises a current mirror 38 for mirroring a temperature-independent current. The current mirror 38 preferably comprises two n-channel field-effect transistors. A temperature-constant or temperature-independent current I_CONST flows at the output of the current mirror 38.

The output current I_DIFF of the differential current source 14, which is the capacitor charging current, results from the difference between I_TEMP and I_CONST or from equation (1) as:

$$I\_DIFF = I\_TEMP - I\_CONST \qquad (1)$$

The operation of the device 10 in accordance with a preferred embodiment of the present invention we described below.

The capacitor is charged by means of the differential current I_DIFF. The voltage V_C present at the capacitor C is compared with a predeterminable temperature-independent voltage V_REF by the comparator 12. If the voltage V_C present at the capacitor at C reaches the value V_REF or exceeds the latter, the comparator 12 outputs a refresh signal at its output 28. At the same time as the output signal, the switch S is closed and the capacitor C discharges again.

Afterward, the switch S is opened again and the above-described process proceeds anew. The capacitor C, the comparator 12 and the switch S thus essentially form a temperature-dependent oscillator for generating the refresh signal.

The capacitor is charged faster or more slowly depending on the intensity of the current I_DIFF, so that the capacitor voltage V_C reaches the reference voltage V_REF faster or more slowly and a refresh signal is output.

The temperature gradient f of the differential current I_DIFF is dependent, in particular, on the factor n of the first current mirror 34 and the current intensity of the temperature-independent current I_CONST. The temperature gradient f can be determined by means of equation (2) or equation (3):

$$f = \frac{\text{I\_DIFF}(T1)}{\text{I\_DIFF}(T2)} \quad (2)$$

$$f = \frac{n * \text{I\_BG}(T1) - \text{I\_CONST}}{n * \text{I\_BG}(T2) - \text{I\_CONST}} \quad (3)$$

The time T_RS required to charge the capacitor C up to the reference voltage V_REF, and thus the time between two refresh signals, can be determined in accordance with equation (4).

$$\_RS = \frac{C * \text{V\_REF}}{\text{I\_DIFF}} \quad (4)$$

As can be seen from equation (4), T_RS is inversely proportional to the current intensity of the differential current, i.e. the larger I_DIFF, the shorter T_RS. In low temperature ranges, I_DIFF is lower than at high temperatures, so that a refresh signal is output less often if the semiconductor memory device is operated at lower temperatures. A current saving can thereby be achieved. By contrast, at high temperatures it may be necessary to output a refresh signal more often. This can be achieved by faster charging of the capacitor C with an increased charging current I_DIFF.

The invention claimed is:

1. A circuit for generating a refresh signal for a memory cell of a semiconductor memory, the circuit comprising:
    a capacitor;
    a differential current source for providing a charging current to the capacitor, the differential current source including:
        a temperature-dependent current source for providing a temperature-dependent current, and
        a temperature-independent current source for providing a temperature-independent current,
        the temperature-dependent current source and the temperature-independent current source being connected such that the charging current is proportional to a difference between the temperature-dependent current and the temperature-independent current; and
    a comparator having
        a capacitor input connected to a first terminal of the capacitor, and
        a reference input connected to a reference voltage,
        the comparator being configured to generate a refresh signal when the voltage present at the capacitor input exceeds the voltage present at the reference input.

2. The circuit of claim 1, further comprising a switch for resetting the capacitor.

3. The circuit of claim 2, wherein the switch is configured to reset the capacitor when the comparator generates the refresh signal.

4. The circuit of claim 1, wherein the temperature-dependent current source is configured to generate a temperature-dependent current that is proportional to a current of a bandgap circuit associated with the semiconductor memory.

5. The circuit of claim 1, wherein the temperature-dependent current source comprises a first current mirror configured to mirror a temperature-dependent current.

6. The circuit of claim 5, wherein the first current mirror is configured to multiply a temperature-dependent current.

7. The circuit of claim 5, further comprising a second current mirror configured to mirror an output current of the first current mirror.

8. The circuit of claim 1, wherein the temperature-independent current source comprises a current mirror configured to mirror a temperature-independent current.

9. The circuit of claim 1, wherein the memory cell comprises a DRAM memory cell.

10. A DRAM memory having a memory cell configured to receive a refresh signal from the circuit of claim 1.

11. The circuit of claim 1, further comprising a temperature-independent voltage source configured to maintain a temperature-independent voltage at a second terminal of the capacitor, and wherein the first terminal of the capacitor is connected to the differential current source.

12. A method for generating a refresh signal for a memory cell of a semiconductor memory, the method comprising:
    charging a capacitor with a current proportional to a difference between a temperature-dependent current and a temperature-independent current;
    comparing a voltage at the capacitor with a reference voltage; and outputting the refresh signal when a capacitor voltage exceeds the reference voltage.

13. The method of claim 12, further comprising resetting the capacitor concurrently with outputting the refresh signal.

14. A circuit for providing a refresh signal to a memory cell, the circuit comprising:
    a temperature-dependent oscillator configured to periodically generate a refresh signal at a frequency that depends on a temperature of the memory cell, the temperature-dependent oscillator including
        a capacitor;
        a switch connected across the capacitor for periodically discharging the capacitor; and
    a comparator having:
        a capacitor input connected to a first terminal of the capacitor, and
        a reference input connected to a reference voltage,
    a refresh signal output in communication with the memory cell, and
    a reset signal output in communication with the switch,
        the comparator being configured to, when the voltage present at the capacitor input exceeds the voltage present at the reference input,
    generate a refresh signal to be provided to the memory cell, and
        generate a reset signal to cause the switch to discharge the capacitor; and
        means for providing, to the oscillator, a signal indicative of the temperature of the memory cell.

* * * * *